United States Patent
Seike et al.

(10) Patent No.: US 7,686,022 B2
(45) Date of Patent: Mar. 30, 2010

(54) NOZZLE DEVICE, AND CLEANING APPARATUS EQUIPPED WITH THE NOZZLE DEVICE

(75) Inventors: Yoshiyuki Seike, Owariasahi (JP); Keiji Miyachi, Owariasahi (JP)

(73) Assignee: Asahi Sunac Corporation, Owariasahi-shi (JP)

( * ) Notice: Subject to any disclaimer, the term of this patent is extended or adjusted under 35 U.S.C. 154(b) by 433 days.

(21) Appl. No.: 11/682,944

(22) Filed: Mar. 7, 2007

(65) Prior Publication Data

US 2007/0210190 A1    Sep. 13, 2007

(30) Foreign Application Priority Data

Mar. 8, 2006    (JP)    ............... 2006-063252

(51) Int. Cl.
 *B08B 3/00*    (2006.01)
(52) U.S. Cl. .................. 134/148; 134/144; 134/119; 134/102.2; 134/103.2; 239/224; 239/223; 239/291; 239/214
(58) Field of Classification Search ............. 134/22.18, 134/26, 33, 34, 38, 198, 199, 191, 144, 148, 134/119, 102.2, 103.2; 239/290–301, 223, 239/505, 224; 427/236; 118/300–326
See application file for complete search history.

(56) References Cited

U.S. PATENT DOCUMENTS

| | | | | |
|---|---|---|---|---|
| 4,148,932 A | * | 4/1979 | Tada et al. | ...................... 239/3 |
| 4,997,130 A | * | 3/1991 | Weinstein | ................... 239/222 |
| 6,553,792 B1 | * | 4/2003 | Amari et al. | ................... 68/147 |
| 6,802,459 B2 | * | 10/2004 | Renkl et al. | ................. 239/290 |

OTHER PUBLICATIONS

Handbook of Industrial Cleaning Techniques (in Japanese), Realize Riko Center 1994; Discussed in Specification.
Q&A: Manual on the Theory of Cleaning and Applied Operations (in Japanese), R&D Planning Shuppan 2001; Discussed in Specification.

* cited by examiner

*Primary Examiner*—Dinh Q Nguyen
(74) *Attorney, Agent, or Firm*—David S. Safran; Roberts Mlotkowski Safran & Cole, P.C.

(57) ABSTRACT

The present invention provides a nozzle device comprising a substantially cylindrical nozzle body and a cup member which is arranged within the cylinder of the nozzle body and jets out fluid droplets from the tip thereof while being driven to turn, wherein two or more fluids including a detergent and a gas are mixed and jetted out of the tip of the nozzle in order to achieve sufficient cleaning of a single wafer without a re-adhesion of contamination or destruction of the pattern of the wafer. Therefore, the fluid droplets can be controlled to a smaller size than the conventional double-fluid cleaning system or high pressure jet system.

8 Claims, 12 Drawing Sheets

NOZZLE DEVICE, AND CLEANING APPARATUS EQUIPPED WITH THE NOZZLE DEVICE

BACKGROUND OF THE INVENTION

1. Field of the Invention

The present invention relates to a nozzle device and a cleaning apparatus equipped with the nozzle device, and more particularly to a high performance nozzle device suitable for use in single wafer cleaning in the manufacture of semiconductor integrated circuits and the like and a cleaning apparatus equipped with the nozzle device.

2. Description of the Related Art

In recent years, the main stream of the cleaning step as part of the manufacturing process of semiconductor integrated circuits and the like is shifting from the batch watching system, by which wafers are dipped in cleaning fluid, to the single wafer cleaning system to address the need for small lot production of many different types. The following systems are known to be suitable for such single wafer cleaning (see, for instance, Handbook of Industrial Cleaning Techniques (in Japanese), Realize Riko Center 1994 and Q&A: Manual on the Theory of Cleaning and Applied Operations (in Japanese), R&D Planning Shuppan 2001).

1) Brush cleaning system
2) Low pressure shower cleaning system
3) Ultrasonic shower cleaning system
4) Cavitation jet cleaning system
5) Two-fluid cleaning system
6) High pressure jet cleaning system

SUMMARY OF THE INVENTION

The conventional cleaning systems listed above, however, involve one or another of the following problems, which at present are found extremely difficult to overcome.

1) The brush cleaning system, though powerful in cleaning effect, suffers from re-adhesion of contamination or destruction of the pattern by the shearing force applied by the brush.

2) The low pressure shower cleaning system is insufficient in cleaning power because of the low speed of jetted liquid droplets.

3) The ultrasonic shower cleaning system may invite destruction of the pattern by cavitation due to ultrasonic oscillation. Moreover, as the object of cleaning is determined by the ultrasonic frequency, only specific contamination (particles) can be cleaned.

4) The cavitation jet cleaning system can exert little cavitation effect and accordingly is insufficient in cleaning power.

5) The double-fluid cleaning system, though excelling in cleaning power, involves difficulty in controlling the fluid droplet size and the speed of droplets (changing the fluid droplet size or the speed of droplets requires replacement of the nozzle). Moreover, the presence of large droplets or fast moving droplets may destroy the pattern.

6) The high pressure jet cleaning system, though excelling in cleaning power, involves the same problems as 5). Namely, it is difficult to control the fluid droplet size and the speed of droplets (changing the fluid droplet size or the speed of droplets requires replacement of the nozzle). Moreover, the presence of large droplets or fast moving droplets may destroy the pattern.

An object of the present invention, attempted in view of these circumstances, is to provide a nozzle device suitable for use in single wafer cleaning in the manufacture of semiconductor integrated circuits and the like, which can solve these problems, and a cleaning apparatus equipped with this nozzle device.

In order to achieve the foregoing object, according to a first aspect of the invention, there is provided a nozzle device comprising a substantially cylindrical nozzle body and a cup member which is arranged within the cylinder of the nozzle body and jets out fluid droplets from the tip thereof while being driven to turn, wherein two or more fluids including a detergent and a gas are mixed and jetted out of the tip of the nozzle.

According to the first aspect of the invention, since the nozzle device comprises a nozzle body and a cup member which jets out fluid droplets from the tip thereof while being driven to turn, wherein two or more fluids including a detergent and a gas are mixed and jetted out of the tip of the nozzle, the fluid droplets can be controlled to a smaller size than the conventional double-fluid cleaning system or high pressure jet system, enabling the problems noted above to be successfully overcome.

According to a second aspect of the invention, there is provided a version of the nozzle device according to the first aspect, wherein the cup member is driven to turn by turbine air fed to the nozzle device. According to the second aspect of the invention, as the cup member is driven to turn by turbine air, the number of revolutions of the cup member can be set higher. Also, by adjusting the quantity of the turbine air that is fed to the nozzle device, it is made possible to control the droplet size and droplets speed of the fluid to respectively desired values and to achieve cleaning in a broad range of conditions.

According to a third aspect of the invention, there is provided a version of the nozzle device according to the first or second aspect, wherein the opening angle of the mixed fluid that is jetted out of the tip of the nozzle is controlled with the shaving air that is fed to the nozzle device. According to the third aspect of the invention, as the opening angle of the mixed fluid that is jetted out is controlled with shaving air, cleaning can be achieved in a broad range of conditions.

According to a fourth aspect of the invention, there is provided a version of the nozzle device according to any one of the first through third aspects, wherein the cup member is rotationally supported without contact by bearing air that is fed to the nozzle device. According to the fourth aspect of the invention, as the cup member is rotationally supported without contact by bearing air, dust generation from the apparatus can be restrained, and the cup member can be easily turned at high speed.

According to a fifth aspect of the invention, there is provided a version of the nozzle device according to any one of the first through fourth aspects, further provided with a sensor device which detects the number of revolutions of the cup member, wherein the number of revolutions is controlled according to the feedback of the number of revolutions of the cup member detected by the sensor device. According to the fifth aspect of the invention, since the cup member is subjected to the feedback control as detected by the sensor device, the number of revolutions of the cup member can be easily accomplished.

According to a sixth aspect of the invention, there is provided a version of the nozzle device according to any one of the first through fifth aspects, further provided with a sensor device which detects the number of revolutions of the cup member, wherein the number of revolutions of the cup member detected by the sensor device is displayed.

According to a seventh aspect of the invention, there is provided a version of the nozzle device according to any one of the first through sixth aspects, wherein a plurality of through holes are formed in the cup member in the circumferential direction, and the detergent is jetted out of the through holes. According to the seventh aspect of the invention, as a plurality of through holes are formed in the cup member in the circumferential direction, the detergent can be jetted out evenly.

According to an eighth aspect of the invention, there is provided a version of the nozzle device according to the seventh aspect, wherein the through holes are inclined outward at an angle α to the axis of the cup member. According to the eighth aspect of the invention, as the through holes are inclined outward at an angle α to the axis, a preferable spray pattern can be formed.

According to a ninth aspect of the invention, there is provided a version of the nozzle device according to any one of the first through eighth aspects, wherein the tip part of the cup member is formed to be concave inward, and the inner circumferential edge of the concave is formed to be inclined outward at an angle α to the axis of the cup member. According to the ninth aspect of the invention, as the tip part of the cup member is formed to be concave inward, an even more preferable spray pattern can be formed.

According to a tenth aspect of the invention, there is provided a version of the nozzle device according to the ninth aspect, wherein a plurality of grooves are formed in the inner circumferential edge of the concave in the tip part of the cup member. According to the tenth aspect of the invention, as a plurality of grooves are formed in the inner circumferential edge of the concave in the tip part of the cup member, an even more preferable spray pattern can be formed.

According to an eleventh aspect of the invention, there is provided a version of the nozzle device according to any one of the first through tenth aspects, wherein the shaving air is fed to the outer circumferential side of the cup member. According to the eleventh aspect of the invention, as the shaving air is fed to the outer circumferential side of the cup member, the spray pattern can be controlled with the shaving air.

According to a twelfth aspect of the invention, there is provided a version of the nozzle device according to any one of the first through tenth aspects, wherein the shaving air is fed between an air cap arranged on the outer circumferential side of the cup member and the nozzle body. According to the twelfth aspect of the invention, the shaving air is fed between an air cap and the nozzle body, the spray pattern can be controlled with the shaving air.

According to a thirteenth aspect of the invention, there is provided a version of the nozzle device according to the twelfth aspect, wherein spirally shaped air guides are formed on the outer circumference of the air cap. According to the thirteenth aspect of the invention, as spirally shaped air guides are formed on the outer circumference of the air cap, the flow of the shaving air can be swirled, and the spray pattern can be even more preferably controlled with the shaving air.

According to a fourteenth aspect of the invention, there is provided a version of the nozzle device according to any one of the first through thirteenth aspects, wherein the speed of fluid droplets jetted out of the nozzle tip is 0.1 to 100 m/second. According to a fifteenth aspect of the invention, there is provided a version of the nozzle device according to any one of the first through fourteenth aspects, wherein the droplet size of the fluid jetted out of the nozzle tip is not more than 100 μm. According to the fourteenth and fifteenth aspects of the invention, as the speed and size of the fluid droplets are controlled within the optimal range, satisfactory cleaning results can be achieved.

The present invention can help provide satisfactory cleaning results.

DETAILED DESCRIPTION OF THE PREFERRED EMBODIMENTS

A nozzle device and a cleaning apparatus equipped with this nozzle device embodying the present invention in a preferred mode will be described in detail below with reference to the accompanying drawings.

Figure 1:
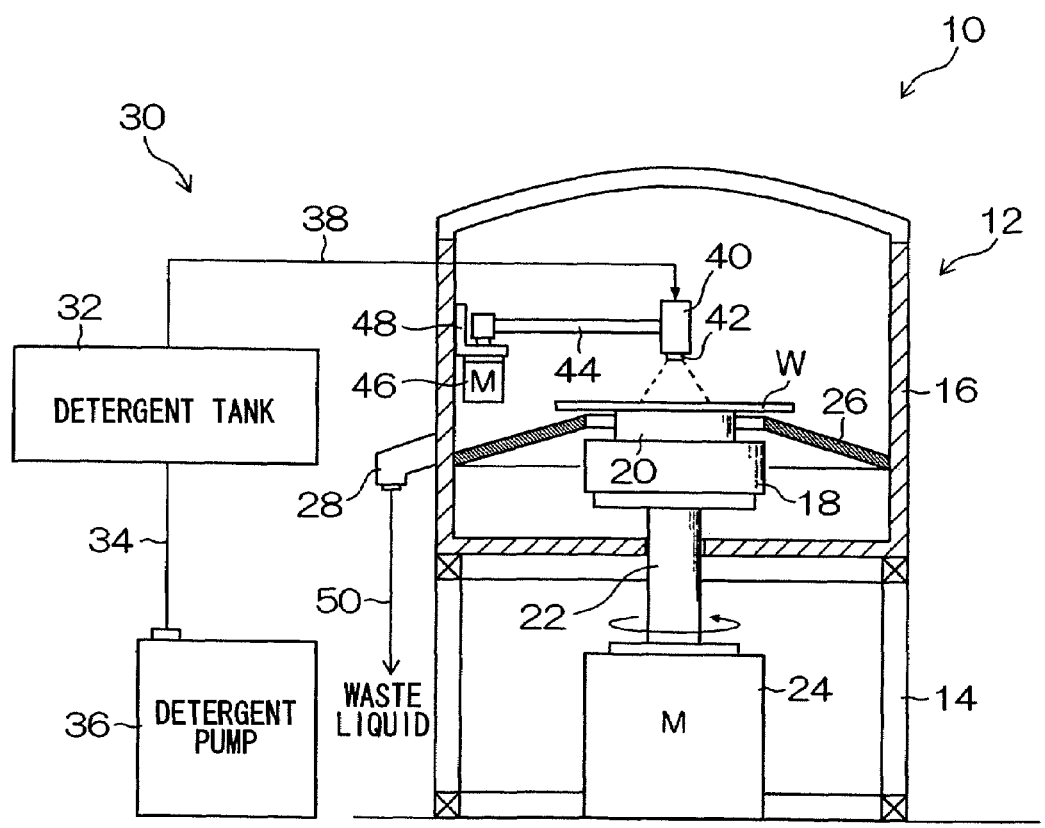
FIG. 1 shows an overall configuration of a cleaning apparatus to which a nozzle device according to the invention is applied.
Figure 2:
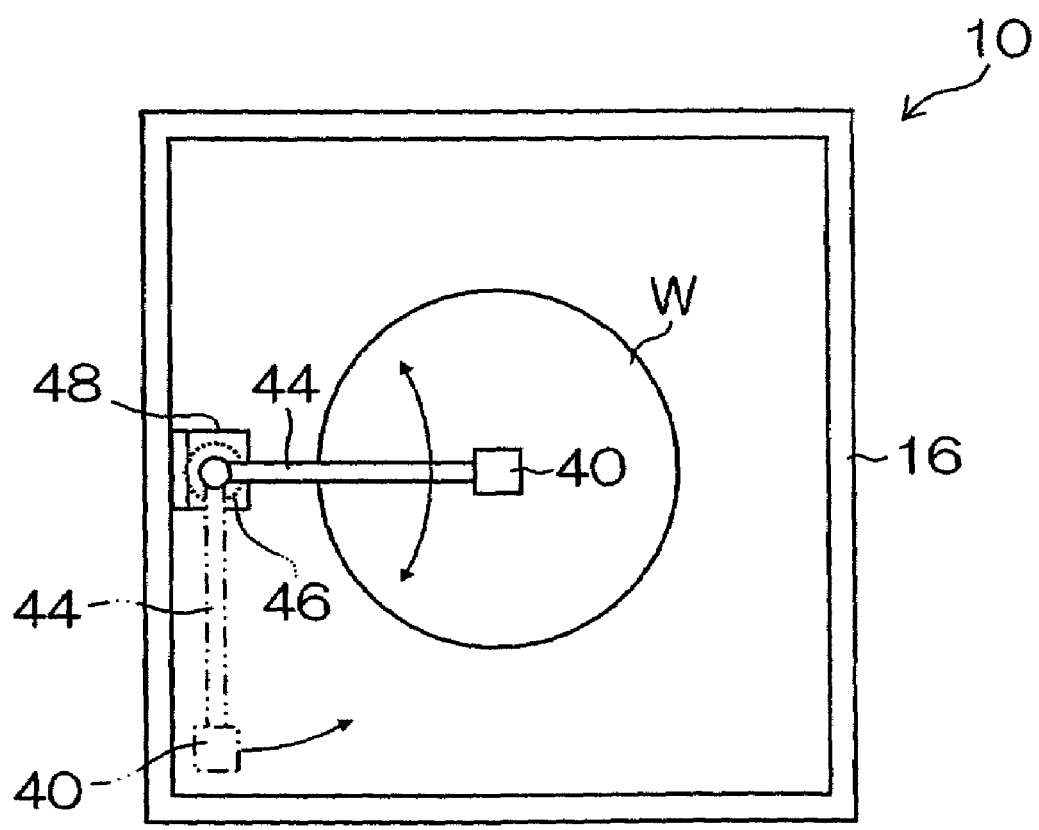
FIG. 2 shows a plan of the configuration of the essential part of FIG. 1.

FIG. 1 shows an overall configuration of the cleaning apparatus to which the nozzle device according to the invention is applied, and FIG. 2, a plan of the configuration of its essential part. As shown in FIG. 1 and FIG. 2, this cleaning apparatus 10 comprises a wafer turning device 12 which holds and turns a wafer W to be cleaned and a detergent spraying device 30 which sprays a detergent in an atomized state onto the wafer W being held and turned by that wafer turning device 12.

Incidentally in FIG. 1 and FIG. 2, illustration of a turbine air feeding device (feed piping), a shaving air feeding device (feed piping) and a bearing air feeding device (feed piping) to be described afterwards is dispensed with.

First, the configuration of the wafer turning device 12 will be described. A turntable 18 formed in a disk shape is arranged within a cleaning tub 16 installed on a pedestal 14. A vacuum chuck 20 is provided over the turntable 18, and the wafer W is sucked and held by this vacuum chuck 20.

On the other hand, a spindle 22 is linked to the lower part of the turntable 18, and the output shaft of a turntable driving motor 24 is linked to the lower end of this spindle 22. The turntable 18 is turned by being driven by this turntable driving motor 24.

Next, the configuration of the detergent spraying device 30 will be described. A detergent tank 36 is connected to the input side of a detergent pump 32 which supplies the detergent to the detergent spraying device 30 via a pipe 34. On the other hand, a gun 40 is connected to the output side of the detergent pump 32 via a pipe 38. A spray nozzle 42, which is the nozzle device, is disposed at the tip of the gun 40, and the detergent in an atomized state is sprayed from this spray nozzle 42 onto the wafer W.

This gun 40 is supported by the tip of an arm 44 disposed within the cleaning tub 16 as shown in FIG. 1 and FIG. 2, and the base of this arm 44 is fastened to the output shaft of a motor 46. The motor 46 is supported on the inner wall face of the cleaning tub 16 via a bracket 48, and by driving this motor 46 the arm 44 is swung to cause the gun 40 to move horizontally above the wafer W.

In the detergent spraying device 30 of the above-described configuration, when the detergent pump 32 is driven, the detergent in the detergent tank 36 is sucked into the detergent pump 32 and fed to the gun 40 in a pressurized state. The detergent fed to the gun 40 is sprayed in an atomized state from the jet outlet of the spray nozzle 42. The detergent sprayed from the spray nozzle 42, after hitting the wafer W, falls into the cleaning tub 16 and is guided to a liquid drain 28 via ribs 26 disposed within the cleaning tub 16. It is discarded (or recycled) via a pipe 50 linked to that liquid drain 28.

Figure 3:
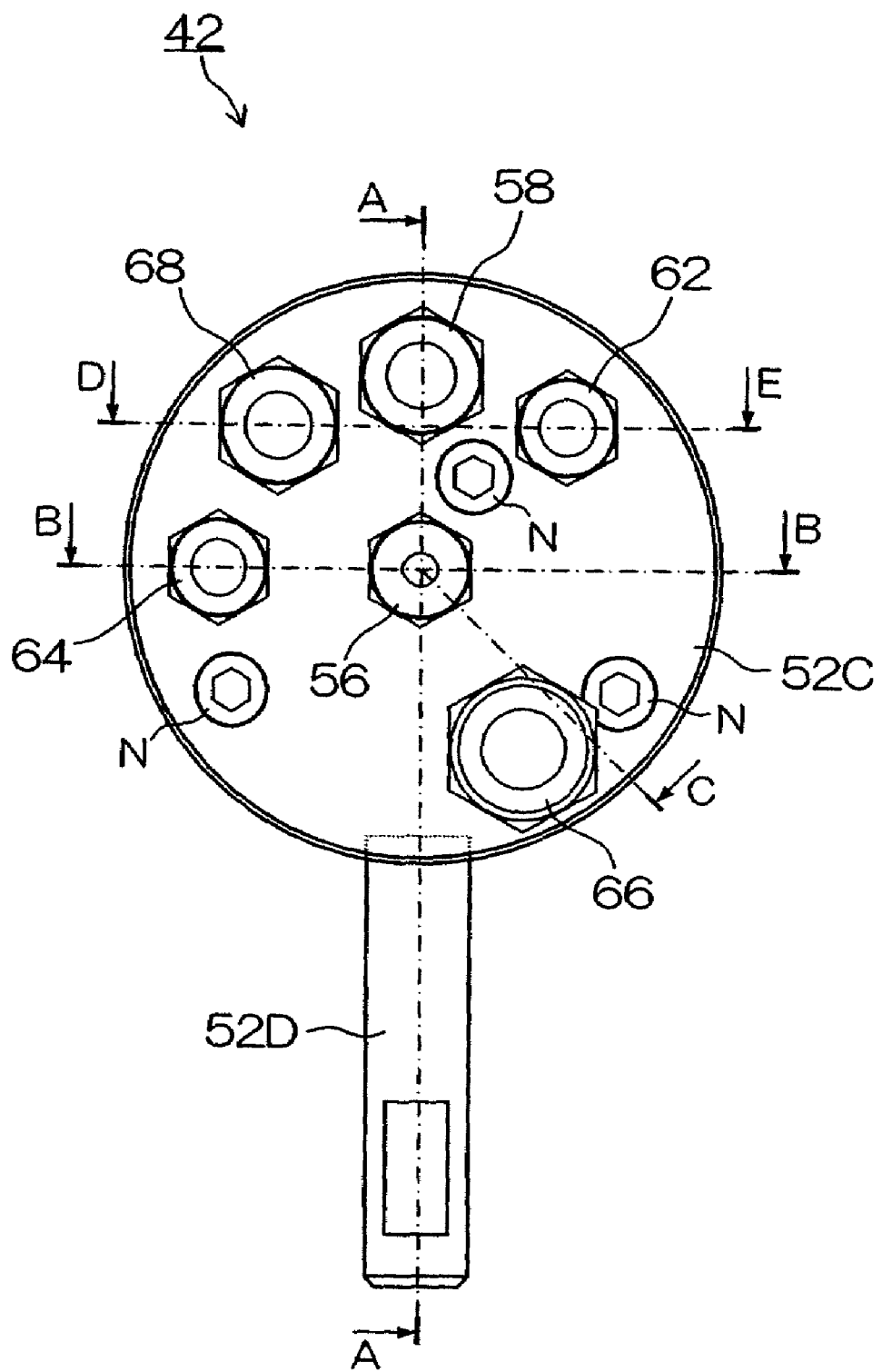
FIG. 3 shows a rear view of the nozzle device according to the invention.
Figure 4:
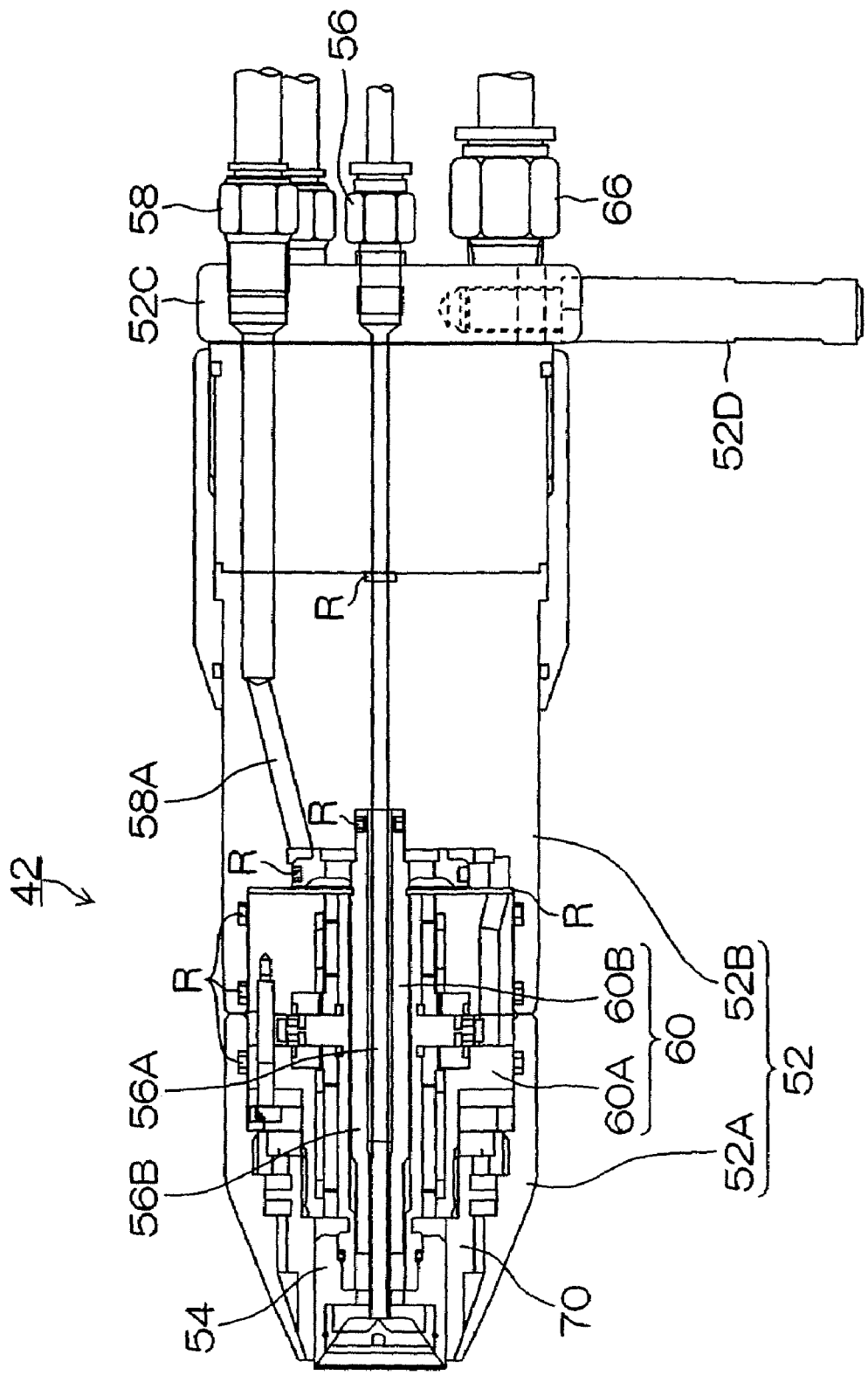
FIG. 4 shows the A-A section of FIG. 3.
Figure 5:
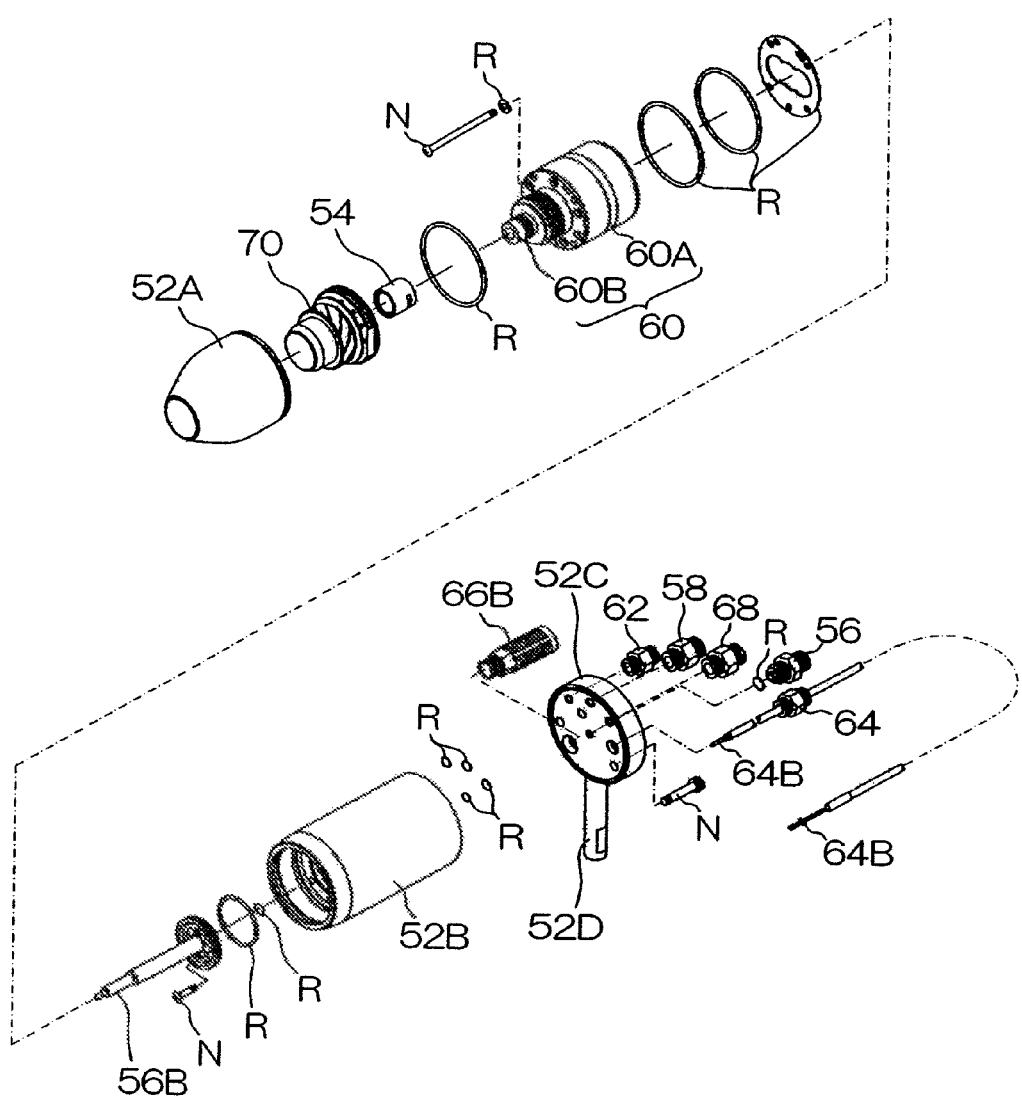
FIG. 5 shows an exploded perspective view of the process of assembling the nozzle device.
Figure 6:
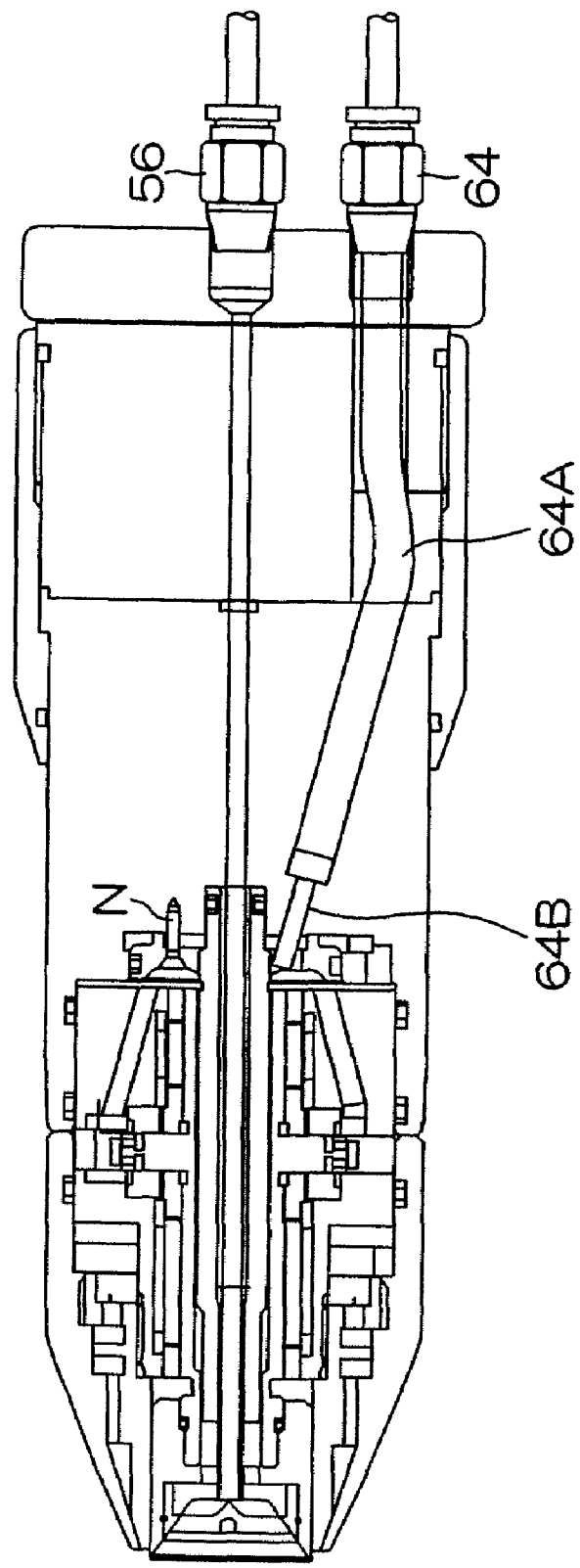
FIG. 6 shows the B-B section of FIG. 3.
Figure 7:
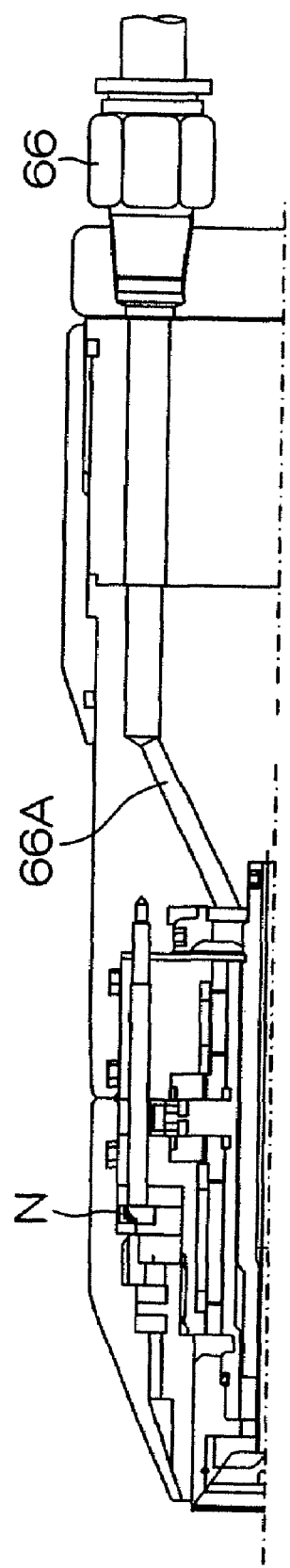
FIG. 7 shows the C section of FIG. 3.
Figure 8:
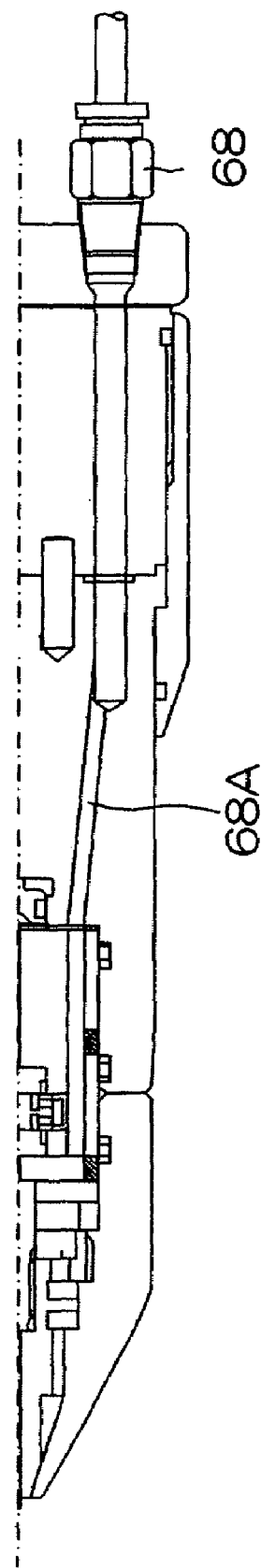
FIG. 8 shows the D section of FIG. 3.
Figure 9:
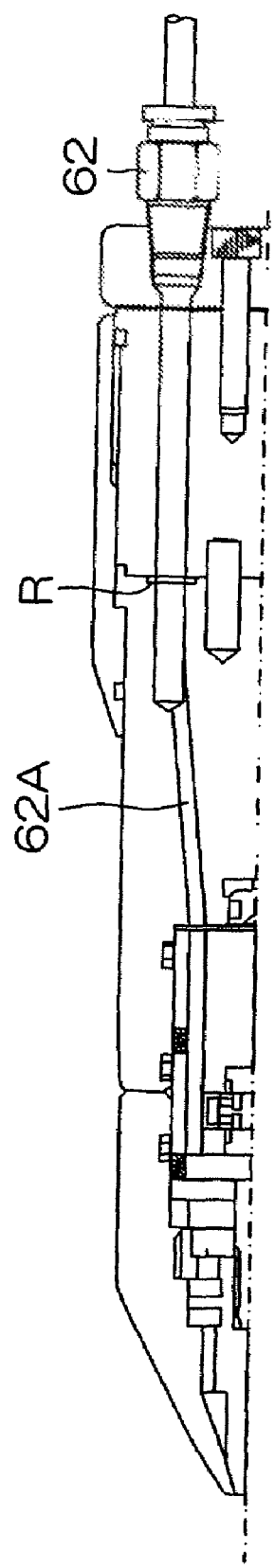
FIG. 9 shows the E section of FIG. 3.

Next, the configuration of the nozzle device (the spray nozzle 42), which is a characteristic part of the invention, will be described in detail. FIG. 3 shows a rear view (the top view in FIG. 1) of the nozzle device 42, FIG. 4 shows the A-A section of FIG. 3, and FIG. 5 shows an exploded perspective view of the process of assembling the nozzle device 42. FIG. 6 shows the B-B section of FIG. 3, FIG. 7 shows the C section of FIG. 3, FIG. 8 shows the D section of FIG. 3, and FIG. 9 shows the E section of FIG. 3.

This spray nozzle 42 is provided with a substantially cylindrical nozzle body 52 and a cup member 54 which is arranged within the cylinder of this nozzle body 52 and jets out fluid droplets from the tip while being driven to turn. The nozzle body 52 is formed of a tip cover 52A and a barrel 52B.

A base 52C is fixed to the rear face of the barrel 52B so as to seal the barrel 52B. A supporting shaft 52D extends to this base 52C.

Whereas this spray nozzle 42 is a nozzle device which jets out from the tip a mixture of two or more fluids including the detergent and a gas, it is so configured that not only the detergent is fed to it by the detergent pump 32 already described but also turbine air, shaving air and bearing air are supplied into it.

As shown in FIG. 3, FIG. 4, FIG. 5 and FIG. 6, the detergent is fed from a detergent feeding joint 56 fixed to the base 52C and, as shown in FIG. 4, is jetted out of the tip of the cup member 54 as fluid droplets via a detergent channel 56A which penetrates the axis of the spray nozzle 42. Incidentally, this detergent channel 56A is formed of a field tube 56B shown in FIG. 4 and FIG. 5 or the like.

As shown in FIG. 3, FIG. 4 and FIG. 5, turbine air is fed from a turbine air feeding joint 58 fixed to the base 52C, is supplied to a spindle 60 via a turbine air channel 58A as shown in FIG. 4, and is enabled to drive the rotation of the rotation shaft 60B of the spindle 60 shown in FIG. 5.

Incidentally, the spindle 60 comprises a cylindrical stator 60A, which is the spindle body, and the rotation shaft 60B disposed rotatably in the cylinder of this stator 60A. The rotation of the rotation shaft 60B is driven by turbine air fed from the rear face of the stator 60A.

The cup member 54 is fixed to the tip of the rotation shaft 60B of the spindle 60. Therefore, the turbine air drives the rotation of the cup member 54.

As shown in FIG. 3, FIG. 5 and FIG. 9, bearing air is fed from a bearing air feeding joint 62 fixed to the base 52C, fed to the spindle 60 via a bearing air channel 62A as shown in FIG. 9, and can rotationally support the rotation shaft 60B of the spindle 60 without contact as shown in FIG. 5. Therefore, the cup member 54 is rotationally supported by the bearing air without contact.

As shown in FIG. 3, FIG. 5 and FIG. 6, a fibrous sensor device 64B is inserted from a sensor joint 64 fixed to the base 52C, and the tip of the sensor device 64B is so arranged as to be positioned on the rear face of the spindle 60 via a sensor passage 64A as shown in FIG. 6 to be enabled to detect the number of revolutions of the rotation shaft 60B of the spindle 60 shown in FIG. 5. Therefore, the number of revolutions of the cup member 54 can be detected by the sensor device 64B.

The number of revolutions of the cup member 54 is controlled by a control device not shown on the basis of the feedback of the number of revolutions of the cup member 54 detected by this sensor device 64B.

Turbine air and bearing air fed into the spray nozzle 42 pass a discharged air channel 66A as shown in FIG. 7, and are discharged to the rear face of the spray nozzle 42 from an air discharging joint 66 fixed to the base 52C as shown in FIG. 3, FIG. 4 and FIG. 7. Incidentally, a muffler 66B shown in FIG. 5 is fitted to the rear face of the air discharging joint 66.

As shown in FIG. 3, FIG. 5 and FIG. 8, shaving air is fed from a shaving air feeding joint 68 fixed to the base 52C, and is supplied to the periphery of the spindle 60 via a shaving air channel 68A as shown in FIG. 8, with the opening angle of the mixed fluid jetted out from the tip of the nozzle being controlled. Details of this aspect will be described below.

As shown in FIG. 4 and FIG. 5, gaps are formed between an air cap 70 and the tip cover 52A (the nozzle body 52) arranged on the outer circumferential side of the cup member 54, and the shaving air that is fed jets out of these gaps.

Figure 10:
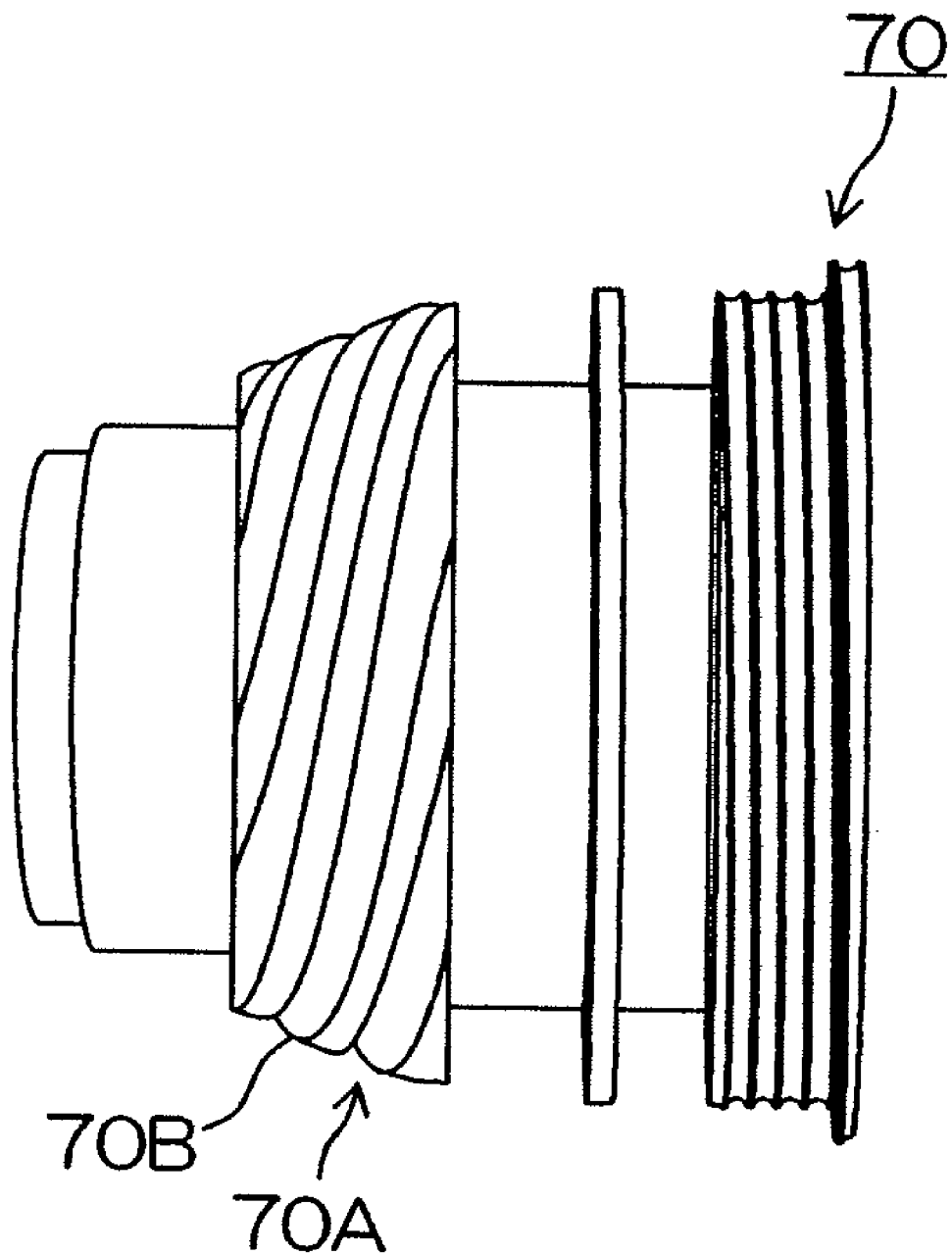
FIG. 10 shows the front view of an air cap.

FIG. 10 shows the front view of the air cap 70. A tapered face 70A constituting these gaps is formed on the outer circumference of this air cap 70, and air guides 70B, which are spiral convex strips, are formed on this tapered face 70A.

The above-described configuration of the air cap 70 causes the shaving air fed into the gaps between the air cap 70 and the tip cover 52A to form air flows along the spiral shape of the air guides 70B and to be jetted out from the nozzle tip while turning counterclockwise. These flows of shaving air enable the opening angle of the mixed fluid jetted out from the nozzle tip to be controlled.

Figure 11:
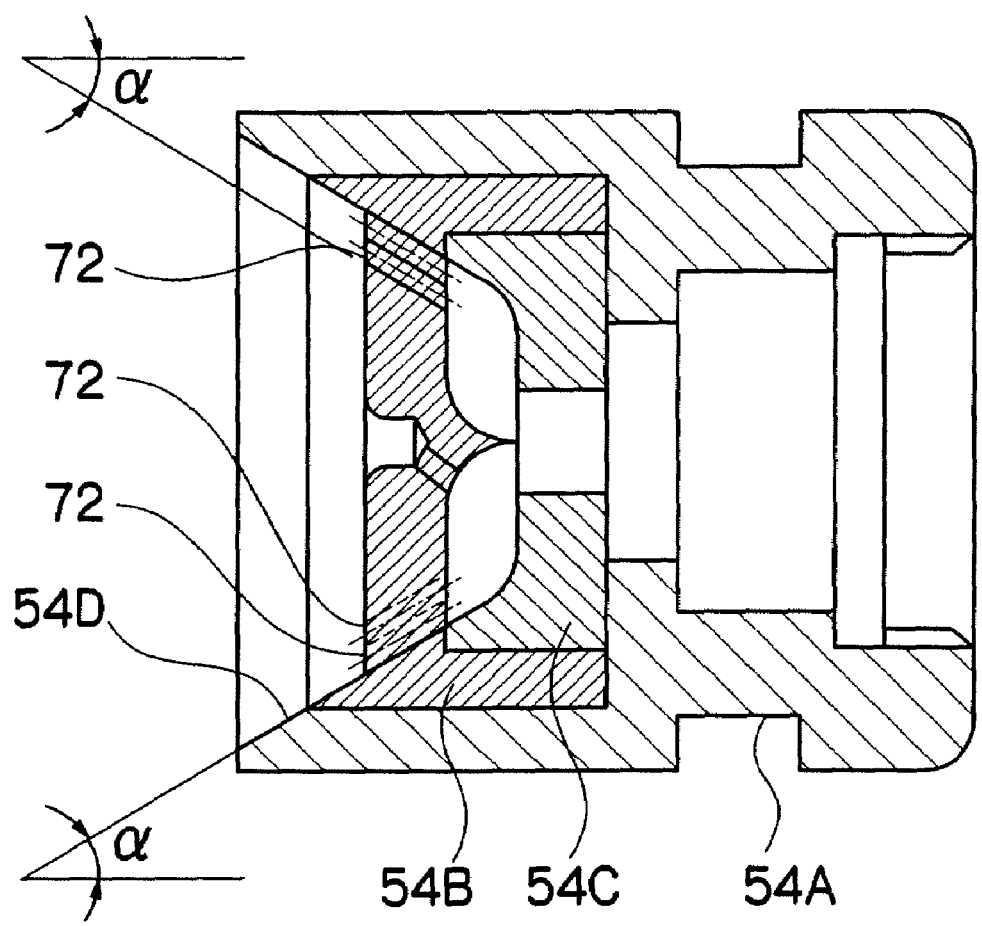
FIG. 11 shows a frontal section of a cup member.

Next, the detailed configuration of the cup member 54 will be described. FIG. 11 shows a frontal section of the cup member 54, and FIG. 12, a left profile of the cup member 54. As shown in FIG. 11, this cup member 54 is configured by combining three members including an outer 54A, an inner 54B and an insert 54C.

A female thread is cut inside a through hole in the rear face of the outer 54A to enable the tip of the rotation shaft 60B of the spindle 60 to be screwed in. Therefore, the detergent can be fed from the detergent channel 56A into the cup member 54.

The tip part of the cup member 54 is formed to be concave inward, and the inner circumferential edge 54D of this concave is formed to be inclined outward at an angle $\alpha$ to the axis of the cup member 54. It is preferable for this angle $\alpha$ to be 15 to 45 degrees.

Figure 13:
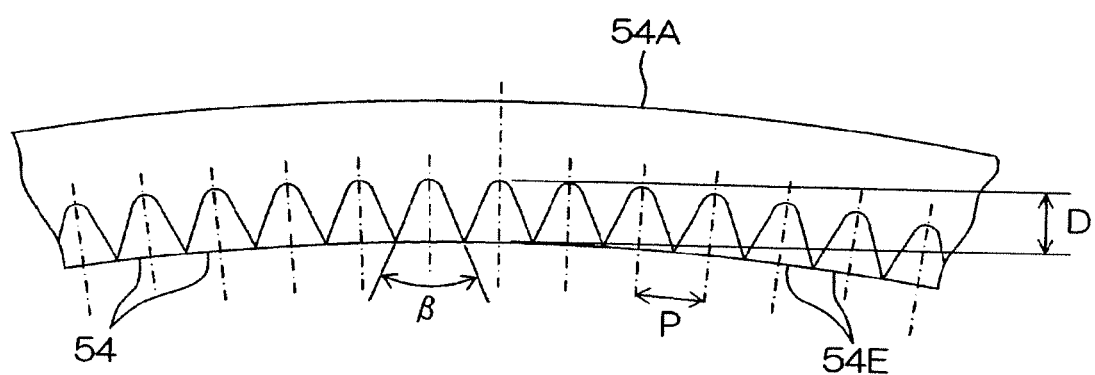
FIG. 13 shows a partially enlarged view of the cup member.

Grooves 54E, 54E . . . of a prescribed pitch P are formed all around the inner circumferential edge 54D (more specifically the inner circumferential edge of the outer 54A) of this concave as the partially enlarged view of FIG. 13 shows. Though there is no particular limitation to the pitch P of these grooves 54E, it can be 0.1 to 0.5 mm. Nor is there any particular limitation to the depth D of these grooves 54E, but it can also be 0.1 to 0.5 mm.

It is preferable for the opening angle $\beta$ of these grooves 54E to be 30 to 60 degrees. It is also preferable for these grooves 54E, 54E . . . to have no flat part between them.

Figure 12:
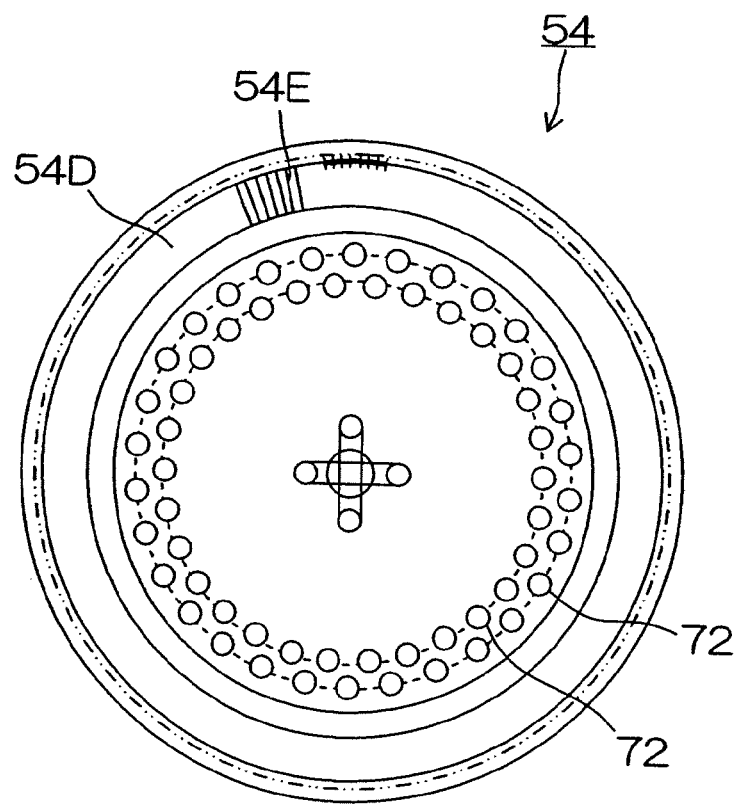
FIG. 12 shows a left profile of the cup member.

As shown in FIG. 11 and FIG. 12 inner 54B has through holes 72, 72 . . . all over at a prescribed pitch in two concentric radial positions. These through holes 72 are formed to be inclined outward at an angle $\alpha$ to the axis of the cup member 54. It is preferable for this angle $\alpha$ to be 15 to 45 degrees.

These through holes 72, 72 . . . cause the detergent fed from the detergent channel 56A to be jetted forward at a prescribed angle.

The combination of the constituent elements of the spray nozzle 42 described above enables a desired spray pattern to be formed.

Though not illustrated in any of FIG. 3 through FIG. 9 referred to so far, bolt members N for combining different constituent elements and sealing members R (mainly O rings) for keeping airtightness and watertightness among the constituent elements are also used.

The cleaning method which uses the cleaning apparatus 10 configured as described above as shown in FIG. 1 and FIG. 2 will now be described. First, a carrier robot not shown carries the wafer W, which is the work to be cleaned, onto the vacuum chuck 20 and mounts it there. The wafer W is then sucked and held by that vacuum chuck 20.

Next, the turntable driving motor 24 is driven to turn the turntable 18, and the wafer W starts turning. At the same time, the motor 46 is driven, and the arm 44 swings from a prescribed standby position (the position indicated by double-dot chain lines in FIG. 2) to a prescribed cleaning start position (the position indicated by solid lines in FIG. 2).

Then, the arm 44 starts oscillating horizontally within a prescribed range of angles. As a result, the gun 40 disposed at the tip of the arm 44 starts reciprocating horizontally above the wafer W.

Next, the detergent pump 32 is driven, and the detergent in the detergent tank 36 is sucked into the detergent pump 32. The detergent sucked into the detergent pump 32 is fed to the gun 40 in a pressurized state, and jetted out in an atomized state from the spray nozzle 42 of the gun 40 onto the wafer W. The jetted detergent is sprayed onto the wafer W turning on the turntable 18 to clean the wafer W.

In this process, turbine air, shaving air and bearing air as referred to above are fed to the spray nozzle 42 in addition to the detergent, and jetted onto the wafer W in an atomized state in a prescribed spray pattern.

First, the cup member 54 is rotationally supported without contact by the bearing air that is fed. Therefore, dust generation from the apparatus can be restrained, and the cup member 54 can be easily turned at high speed (e.g. 70000 rpm at the maximum).

Also, the cup member 54 is driven into rotation by the turbine air that is fed. Therefore, the droplet size and droplets speed of the fluid can be controlled to respectively desired values by adjusting the quantity of the turbine air that is fed to achieve cleaning in a broad range of conditions.

Further, the sensor device 64B which detects the number of revolutions of the cup member 54 is provided and the number of revolutions is controlled according to the feedback of the number of revolutions of the cup member 54, which facilitates the control of the number of revolutions of the cup member 54.

Also, the opening angle of the mixed fluid jetted out of the tip of the nozzle is controlled with the shaving air that is fed. Therefore, as the opening angle of the mixed fluid that is jetted out is controlled with the shaving air, cleaning can be accomplished in a broad range of conditions.

In particular, the mixed fluid that is jetted out can be controlled to a desired state by regulating the shaving air that is fed, the above-described various configurational factors applied to the cup member 54 (including the angle α of the inner circumferential edge 54D, the grooves 54E, the angle β of the grooves 54E, the through holes 72 and the angle α of the through holes 72) and the above-described various configu-rational factors applied to the air cap 70 (including the tapered face 70A and the air guides 70B).

As the spray nozzle 42 so far described jets out of its tip a mixture of two or more fluids including the detergent and a gas, the fluid droplets can be controlled to a smaller size than the conventional double-fluid cleaning system or high pressure jet system, enabling the problems noted above to be successfully overcome.

The speed of fluid droplets jetted out of this spray nozzle 42 can be kept at, for instance, 0.1 to 100 m/second. Further, the droplet size of the fluid jetted out of the spray nozzle 42 can be reduced to, for instance, 100 μm or less.

Referring back to FIG. 1 and FIG. 2, the spraying of the detergent is continued for a prescribed length of time, after the lapse of which the driving of the detergent pump 32 and the feeding of various airs are stopped. This ends the spraying of the detergent. After that, the driving of the motor is stopped, and so is the swinging of the arm 44, which then returns to its initial standby state.

On the other hand, the turntable 18 continues to be turned even after this end of the spraying of the detergent, and the centrifugal force generated by the turning of the turntable 18 shakes off the detergent remaining on the wafer W, which is thereby subjected to so-called spin drying. This spin driving of the wafer W is also continued for a prescribed length of time, after the lapse of which the driving of the turntable driving motor 24 is stopped.

After the turntable 18 stops turning, the wafer W is released from chucking by the vacuum chuck 20, and the cleaned wafer W is carried by the carrier robot not shown to the next step.

Incidentally, there is no particular limitation to the detergent to be used in implementing the invention, but the suitable one for the particular purpose of cleaning can be selected for use.

For instance, the SPM detergent which is a mixture of sulfuric acid and hydrogen peroxide water, the APM detergent which is a mixture of ammonia, hydrogen peroxide water and water, the HPM detergent which is a mixture of hydrochloric acid, hydrogen peroxide water and water, the DHF liquid obtained by diluting hydrofluoric acid with water 50 to 200 times, the BHF liquid which is a mixture of hydrofluoric acid and ammonium fluoride, or isopropyl alcohol (IPA) can be used.

The nozzle device and the cleaning apparatus equipped with the nozzle device embodying the present invention in the preferred mode have been hitherto described, but the invention is not limited to this preferred embodiment, but can be implemented in various other ways.

For instance, though the cleaning apparatus 10 is used in this preferred mode, an apparatus in any other appropriate mode, such as a resist removing device, a developing device or a wet etching device can be used as well.

Resist removal and other such procedures are ways of cleaning in a broader sense of the term, to which the nozzle device according to the invention can be applied with equally significant effectiveness.

What is claimed is:

1. A nozzle device for use in semiconductor wafer cleaning comprising:
   a substantially cylindrical nozzle body having inlets for turbine air, bearing airs shaving air and detergent; and
   a cup member which is arranged within an air cap in the nozzle body and is supported without contact by the bearing air supplied to the via the bearing air inlet while being driven to turn by the turbine air fed to the nozzle device via the turbine air inlet;

wherein the cup member has a space in which detergent and air are mixed and a tip part with openings from which mixed detergent and air is jetted out of the tip of the nozzle;

wherein grooved gaps are formed between a peripheral edge of the air cap and a surrounding portion of a tip cover of the nozzle body, said gaps being in communication with shaving air from the inlet for shaving air;

wherein fluid droplets having a droplet size of not more than 100 µm are jetted out of the tip of the nozzle and is controlled with the turbine air that is fed to the nozzle device.

2. A nozzle device for use in semiconductor wafer cleaning comprising:

a substantially cylindrical nozzle body having inlets for turbine air, bearing air shaving air and detergent; and a cup member which is arranged within an air cap in the nozzle body and is supported without contact by the bearing air supplied to the via the bearing air inlet while being driven to turn by the turbine air fed to the nozzle device via the turbine air inlet;

wherein the cup member has a space in which detergent and air are mixed and a tip part with openings from which mixed detergent and air is jetted out of the tip of the nozzle at variable opening angle;

wherein grooved gaps are formed between a peripheral edge of the air cap and a surrounding portion of a tip cover of the nozzle body, said gaps being in communication with shaving air from the inlet for shaving air;

wherein the variable opening angle at which the mixed detergent and air is jetted out of the tip of the nozzle is controlled with the shaving air that is fed to the said gaps.

3. The nozzle device according to claim 2, wherein the speed of fluid droplets jetted out of the nozzle tip is 0.1 to 100 m/second.

4. The nozzle device according to claim 2, wherein the droplet size of fluid jetted out of the nozzle tip is not more than 100 µm.

5. A cleaning apparatus equipped with a nozzle device according to claim 1.

6. The nozzle device according to claim 1, further comprising a sensor device which detects the number of revolutions of the cup member, wherein the number of revolutions is controlled according to the feedback of the number of revolutions of the cup member detected by the sensor device.

7. The nozzle device according to claim 1, further comprising a sensor device which detects the number of revolutions of the cup member, wherein the number of revolutions of the cup member detected by the sensor device is displayed.

8. The nozzle device according to claim 1, wherein the grooved gaps comprise a plurality of spirally shaped air guides formed on the outer circumference of the air cap.

* * * * *